United States Patent
Nene

(10) Patent No.: US 9,136,829 B2
(45) Date of Patent: Sep. 15, 2015

(54) METHOD AND APPARATUS FOR IMPLEMENTING A PROGRAMMABLE HIGH RESOLUTION RAMP SIGNAL IN DIGITALLY CONTROLLED POWER CONVERTERS

(75) Inventor: Hrishikesh Ratnakar Nene, Stafford, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 655 days.

(21) Appl. No.: 13/438,268

(22) Filed: Apr. 3, 2012

(65) Prior Publication Data

US 2013/0063101 A1 Mar. 14, 2013

Related U.S. Application Data

(60) Provisional application No. 61/533,968, filed on Sep. 13, 2011.

(51) Int. Cl.
| | |
|---|---|
| *H03M 1/66* | (2006.01) |
| *H03K 4/02* | (2006.01) |
| *H02M 3/156* | (2006.01) |
| *H02M 1/00* | (2007.01) |

(52) U.S. Cl.
CPC ............... *H03K 4/026* (2013.01); *H02M 3/156* (2013.01); *H02M 2001/0025* (2013.01)

(58) Field of Classification Search
CPC . H02M 3/156; H02M 3/1582; H02M 1/0845; H02M 2001/0025; H03K 4/026; H03M 1/66
USPC .......................................... 341/144, 145, 143
See application file for complete search history.

(56) References Cited

U.S. PATENT DOCUMENTS

| | | | | |
|---|---|---|---|---|
| 4,973,978 | A * | 11/1990 | Jordan .......................... | 341/152 |
| 5,283,515 | A * | 2/1994 | Jordan .......................... | 323/288 |
| 5,675,611 | A * | 10/1997 | Lehtinen et al. ............... | 375/297 |
| 5,861,769 | A * | 1/1999 | Black .............................. | 327/264 |
| 7,038,394 | B2 * | 5/2006 | Yamashita .................. | 315/169.3 |
| 7,071,091 | B2 * | 7/2006 | Clarke et al. ................... | 438/622 |
| 7,358,935 | B2 * | 4/2008 | Yamashita et al. .............. | 345/76 |
| 7,540,916 | B1 * | 6/2009 | Brennan ....................... | 588/313 |
| 8,223,048 | B2 * | 7/2012 | Wilhite ......................... | 341/120 |
| 2005/0169024 | A1 * | 8/2005 | Dwarakanath et al. ......... | 363/98 |
| 2008/0284407 | A1 * | 11/2008 | Miermont et al. ............. | 323/350 |

* cited by examiner

*Primary Examiner* — Jean B Jeanglaude
(74) *Attorney, Agent, or Firm* — John R. Pessetto; Charles A. Brill; Frank D. Cimino

(57) ABSTRACT

A system and method for controlling a power converter includes a digital-to-analog converter (DAC) and ramp generator for generating a reference current command. The DAC is configured to decrement (or increment) to a next state after a fixed number of clock pulses have occurred. The reference current command controls an output of the power converter. Means are provided for delaying an output of the DAC for a number of clock pulses less than the fixed number to increase a resolution of the DAC.

15 Claims, 10 Drawing Sheets

METHOD AND APPARATUS FOR IMPLEMENTING A PROGRAMMABLE HIGH RESOLUTION RAMP SIGNAL IN DIGITALLY CONTROLLED POWER CONVERTERS

CROSS-REFERENCE TO RELATED APPLICATIONS

This application claims the priority benefit of U.S. provisional patent application No. 61/533,968, filed Sep. 13, 2011, which is assigned to the assignee hereof and incorporated herein by reference in its entirety.

BACKGROUND

1. Field

The various circuit embodiments described herein relate in general to methods and apparatuses for increasing the resolution of ramp signal generators, and more particularly to methods and apparatuses of the type described that can be used in the operation of power converters.

2. Background

Ramp generation mechanisms are very useful in power converter applications. For example, they are used to implement peak current mode control (PCMC) techniques. PCMC is often used as a control technique for power converters because of its inherent voltage feed-forward and its automatic cycle-by-cycle current limiting operation. However, power converters employing PCMC schemes often suffer from stability issues and from sub-harmonic oscillations on the output. To overcome these shortcomings, slope compensation mechanisms have been employed. One slope compensation mechanism that has been employed is a ramp signal generator using a digital-to-analog (DAC) converter.

A conventional digitally controlled ramp mechanism works by programming a starting value and a decrement value for the ramp. The decrement value is used by digital subtractor logic to decrement a DAC reference value over a predetermined number of clock cycles. This decrement amount and the number of clock cycles between each decrement together define the slope of the ramp. This is illustrated in FIG. 1, to which reference is now made.

FIG. 1 is a graph of voltage verses time, depicting the operation of a typical 10-bit DAC that generates a ramp voltage output 10 in a system that uses 3.3V as reference voltage. For ease of explanation the ramp voltage output 10 is approximated by a straight line, although it should be understood that the output is subject to a number of nonlinear influences. A decrement of one DAC step corresponding to four clock cycles is assumed. In FIG. 1, for instance, four DAC step decrements 12-15 are illustrated, each corresponding to four clock cycles. The slope value is power converter dependent, i.e., is dependent on the power stage of the application.

The ramp resolution can be measured as the difference between two closest possible ramp outputs for the same slope at a certain time instant. This is shown in FIG. 2, to which reference is now additionally made. Two possible ramp signals 10 and 20 are shown. The ramp signals 10 and 20 are generated using two consecutive starting DAC output values, 'n' 22 and 'n+1' 24 as shown. Again, a decrement of one DAC step over four clock cycles is assumed. The difference between the two consecutive DAC output values 'n' and 'n+1' is equal to the minimum possible DAC value. The maximum DAC resolution dictates this minimum possible DAC output value. For this example, the minimum possible DAC output resolution and consequently the difference between two consecutive DAC output values is approximately equal to 3.3 mV, obtained as $$\frac{DAC \text{ reference voltage}}{2^{DAC \text{ resolution in bits}}} = \frac{3.3\ V}{2^{10}}.$$

Assuming the two ramp signals originating from 'n' and 'n+1' to be approximately parallel to each other, the maximum possible ramp resolution 26 is equal to 3.3 mV, which is equal to the DAC resolution. Thus, in this system, the best possible ramp resolution is limited to the maximum DAC resolution.

A box diagram of a commonly implemented PCMC system 30 using a DAC-ramp generator in a circuit having voltage and current feedback loops is shown in FIG. 3 to which reference is now additionally made. A reference voltage, $V_{ref}$, is applied on line 32 to a voltage controller 34, which also receives a feedback voltage on line 36. The feedback voltage is developed from a voltage output of a power converter 38 that is to be controlled. A simple, duty-controlled buck converter power stage is considered herein; however, the principles are equally applicable to any power converter stage with peak-current mode control. The power converter stage could be, for example, duty-controlled, frequency-controlled, phase-controlled, or the like.

The voltage loop of the voltage controller 34 produces an output 40, which provides the starting voltage value for the DAC-ramp generator circuit 42. A decrement value is applied to the DAC-ramp generator circuit 42 on line 44. The output from the DAC-ramp generator circuit 42 may be in the form illustrated in FIGS. 1 and 2 above, and provides a peak reference current command on line 46 to an analog comparator and PWM (Pulse Width Modulated) generator circuit 48.

A current feedback line 50 from the output of the power converter 38 is compared with the peak reference current command on line 46, and a control signal is applied to the power converter 38 to control the output voltage thereof. The voltage output from the power converter 38 is applied on line 52 to an analog to digital converter (ADC) 54, which generates the feedback voltage on line 36 back to the voltage controller 34.

With reference additionally to FIG. 4, various waveforms produced in the operation of the circuit 30 are shown. Thus, waveform 60 represents the output of the analog comparator and PWM generator 48. Waveform 62 represents the sensed current on line 50. Waveform 64 represents the starting voltage value of the DAC-ramp generator circuit 42 for the first switching cycle. And waveform 66 represents the next possible higher starting voltage value of the DAC-ramp generator circuit 42 for the successive switching cycle.

The peak current reference 64 is driven to keep the regulated system parameter at its desired value. For the power converter system used in this example, it is assumed that the system output voltage from the power converter 38 is the controlled parameter. Thus, the outer voltage loop, including the ADC 54, drives or controls the starting value for the ramp. The decrement value on line 44 governs the slope of the compensating ramp and is usually fixed and power stage dependent. Inc resulting ramp is the peak reference command for controlling the feedback current.

Thus, in a duty-cycle controlled power stage, every time the sensed current (the current feedback on line 50 in FIG. 3) reaches its peak reference limit set by the peak reference command on line 46, the PWM waveform is reset for the remaining time in the PWM period. The PWM waveform is set again at the start of the next PWM cycle. When the sensed current 62 reaches the ramp output that is a result of the starting value of 'n' 64 at point 70, the PWM output 60 is reset 72 and the sensed current 62 declines 74. At the start of the next PWM cycle 76, the sensed current 62 begins to climb again until it reaches the ramp output that is a result of the next possible starting value 'n+1' at point 78, resetting the PWM output 80. This process is continued, as shown. It can be seen that the widths 81, 82, 83, and 84 of the PWM output pulses vary widely from pulse to pulse.

To control a power converter using PCMC, a ramp signal is either added to the sensed current or subtracted from the peak current reference. In a digital PCMC implementation of a PCMC system of the type shown in FIG. 3, the ramp resolution is limited to the resolution of the DAC used for its generation. A high ramp resolution is important for accurate regulation of the power converter output, especially to avoid unwanted output ripple in systems employing an outer control loop with an analog to digital (ADC) converter of higher resolution than the DAC. Furthermore, there is a need for this mechanism to be software programmable via a digital controller, such as a microcontroller (MCU) or digital signal processor (DSP), which imparts more intelligence to the system and provides an ability to adaptively adjust to changing conditions for optimum system performance.

For the system shown in FIG. 3, a desired output voltage level set by $V_{ref}$ is assumed. It is also assumed that the ADC resolution is larger than the DAC resolution for this system. This means:

$$\Delta Vc1 > \Delta Vs$$

where, $\Delta Vc1$=difference between output; voltage values/levels resulting from ramp signals generated by two consecutive ramp starting values, and $\Delta Vs$=difference between two consecutive output voltage values/levels that the ADC can distinguish.

This is shown in FIG. 5, a graph of voltage vs. time, to which reference is now additionally made. As shown, there are multiple possible ADC steps or levels 85-89 between the output levels or steps 92-93 resulting from two consecutive ramp starting values, 'n' and 'n+1'. This is because of the higher ADC resolution than the possible ramp resolution. For a reference voltage value $V_{ref}$ 95, the possible ramp signals and PWM waveforms are shown in FIG. 4.

As seen in FIG. 4, the starting value of the ramp signal changes every cycle between 'n' and 'n+1'. This is because the voltage control loop calculates the starting value of the ramp signal based on ADC feedback signal that has a higher resolution than that of the controlled ramp signal. The starting value of the ramp then oscillates between two closest starting values, 'n' and 'n+1', resulting in an output closest to the desired output.

As shown in FIG. 6, to which reference is now additionally made, this might result in steady state oscillations 96 at the system output. In FIG. 6, the output voltage oscillates between output voltages 92 and 93 resulting from respective ramp starting values of 'n' and 'n+1'. These oscillations are similar to those for non-PCMC controlled converters when the ADC resolution is greater than the PWM resolution.

From the above it can be seen that low resolution of the compensating ramp signal results in a reduced number of control steps, that is, a low control resolution to control the desired output. Also, if the ADC resolution is greater than the DAC resolution, it may also result in steady state oscillations on the output. This behavior is undesirable for many power converter systems. Other solutions require a higher resolution DAC that makes for an expensive solution and also makes it difficult to integrate in an MCU or DSP.

What is needed is a method, apparatus, system, and computer program product by which a higher ramp resolution can be achieved without a corresponding increase in DAC resolution that can be implemented on digital controllers, MCUs, DSPs, or the like. Also needed is a method, apparatus, system, and computer program product that can be used in conjunction with existing ramp and DAC mechanisms in digital controllers, with minimal or no additional digital logic, and which can be implemented using simple software programmable mechanisms that allow easy adaptability for optimum performance under changing system or operating conditions and for easy portability across converter platforms.

SUMMARY

A method, apparatus, computer program product are presented to achieve programmable ramp signals for controlling power converters with higher resolution than possible with the conventional ramp generator mechanism without the need for higher resolution digital-to-analog converters (DACs).

Thus, a method for increasing a resolution of a digital-to-analog converter (DAC) includes operating the DAC to clock to a next state after a fixed number of clock pulses have occurred and delaying an output of the DAC for a number of clock pulses less than the fixed number of clock pulses. A ramp output is generated based on an output of the DAC.

A system for controlling a power converter includes a digital-to-analog converter (DAC) and ramp generator for generating a reference current command. The DAC is configured to clock to a next state after a fixed number of clock pulses have occurred. The reference current command controls an output of the power converter. Means are provided for delaying an output of the DAC for a number of clock pulses less than the fixed number to increase a resolution of the DAC. The system may also include an analog comparator for receiving the reference current command and a feedback current representing an output of the power converter and a PWM generator for producing a PWM voltage for controlling an output of the power converter in response to a comparison of the feedback current and the reference current command. The system may also include an analog-to-digital converter (ADC) to receive an output voltage from the power converter and to provide a digital signal representing the output voltage and a voltage controller for comparing a reference voltage and the digital signal representing the output voltage for providing a starting value to the DAC.

Also disclosed is a method for controlling a power converter. The method includes providing a digital-to-analog converter (DAC) and ramp signal generator to generate a ramp output signal upon which an output from the power converter is based. The DAC is configured to clock to a next state after a fixed number of clock pulses. A start of the DAC is delayed for a number of clock pulses less than the fixed number of clock pulses. The method may also include providing a PWM generator for controlling an output of the power converter according to a comparison between the ramp signal and a signal representing a current feedback from the power converter. The method may also include providing an analog-to-digital converter (ADC) for producing a digital output signal representing an output voltage of the power converter and providing a voltage controller to compare the digital output signal with a reference voltage to provide a starting value to the DAC.

BRIEF DESCRIPTION OF THE DRAWINGS

In the various figures of the drawing, like reference numbers are used to denote like or similar parts.

DETAILED DESCRIPTION

Figure 1:
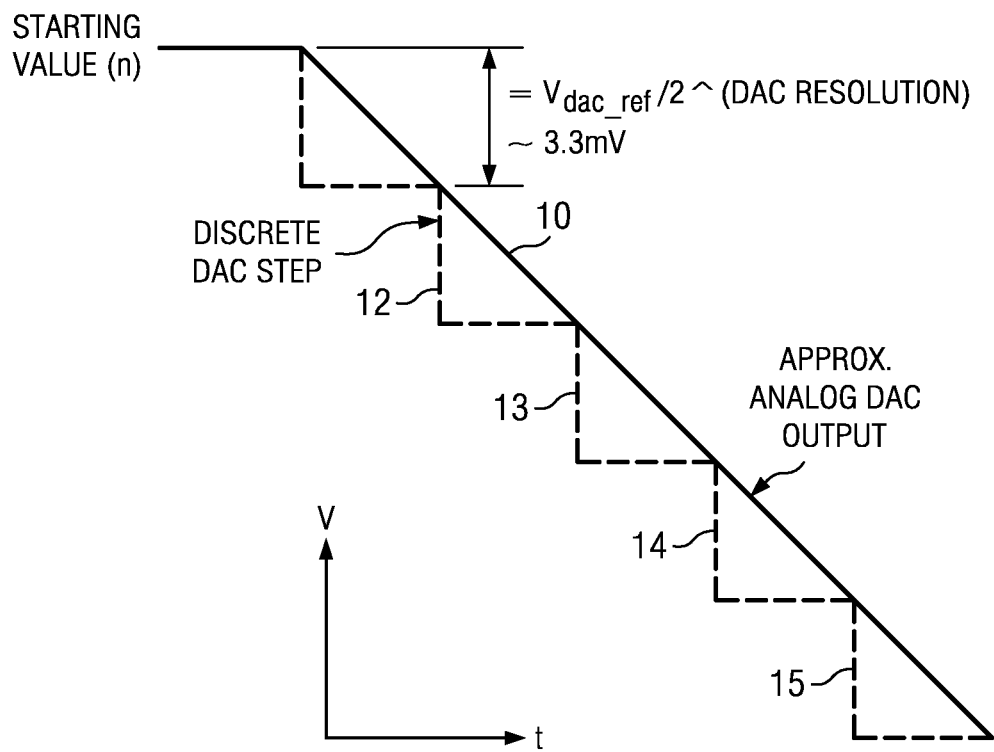
FIG. 1 is a graph of voltage verses time, depicting the operation of a typical 10-bit digital-to-analog converter (DAC) that generates a ramp voltage output in a system that uses 3.3V reference voltage.
Figure 2:
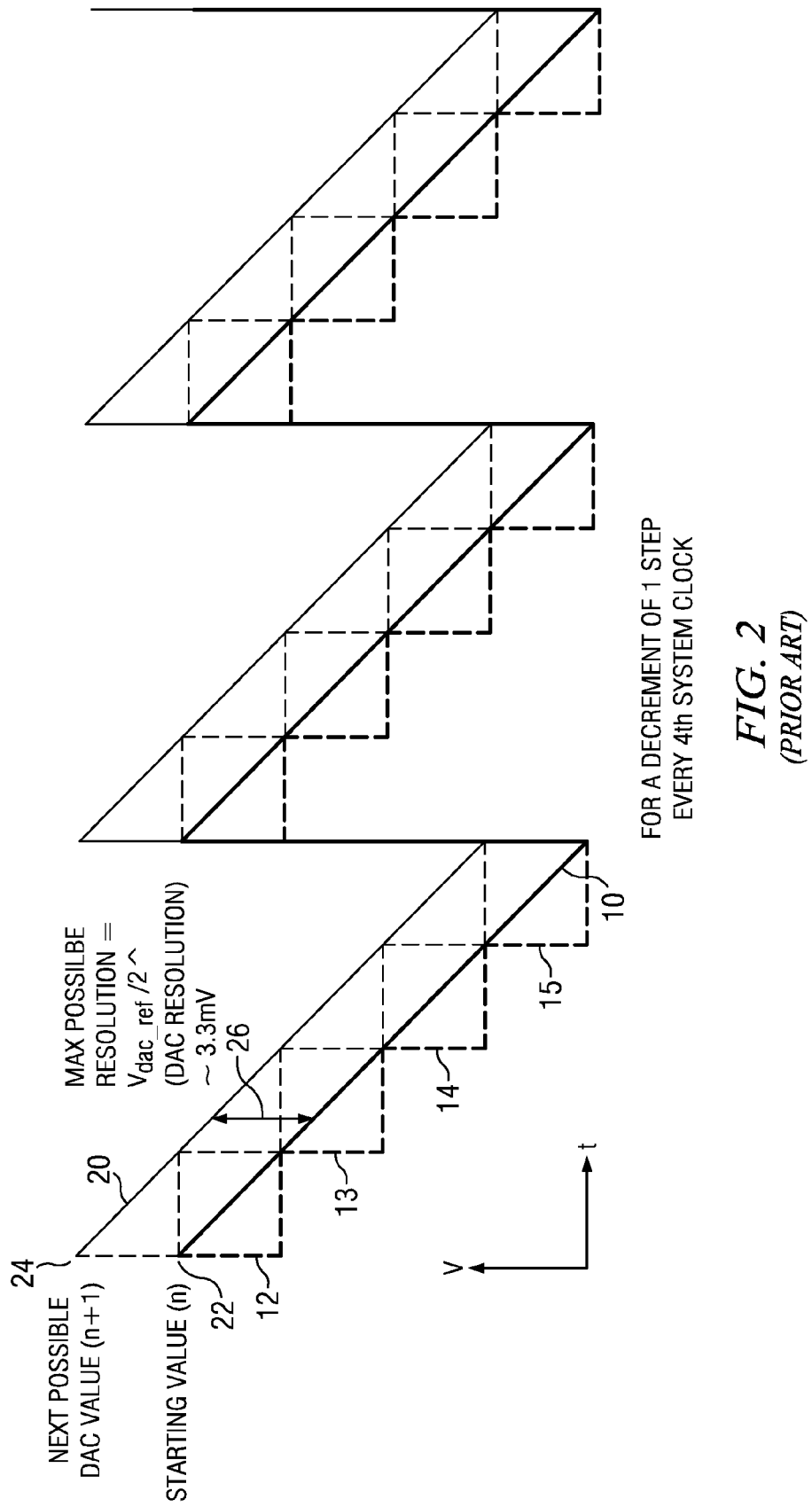
FIG. 2 is a graph of voltage verses time, showing ramp resolution measured as the difference between two closest possible ramp outputs for the same slope at a certain time instant.

The effective resolution of a compensating ramp of a DAC-ramp generator circuit can be increased by introducing a delay at its start. For the example described above with reference to FIG. 2, in which the DAC is decremented by one step every fourth clock cycle, the possible resolution increase is four times. This is obtained by delaying the start of the ramp by successive clock cycles. In the following example, a ramp generator mechanism that subtracts the ramp signal from the peak current reference is used. This description, however, is also applicable to the case when the ramp signal is added to the sensed current.

Figure 7:
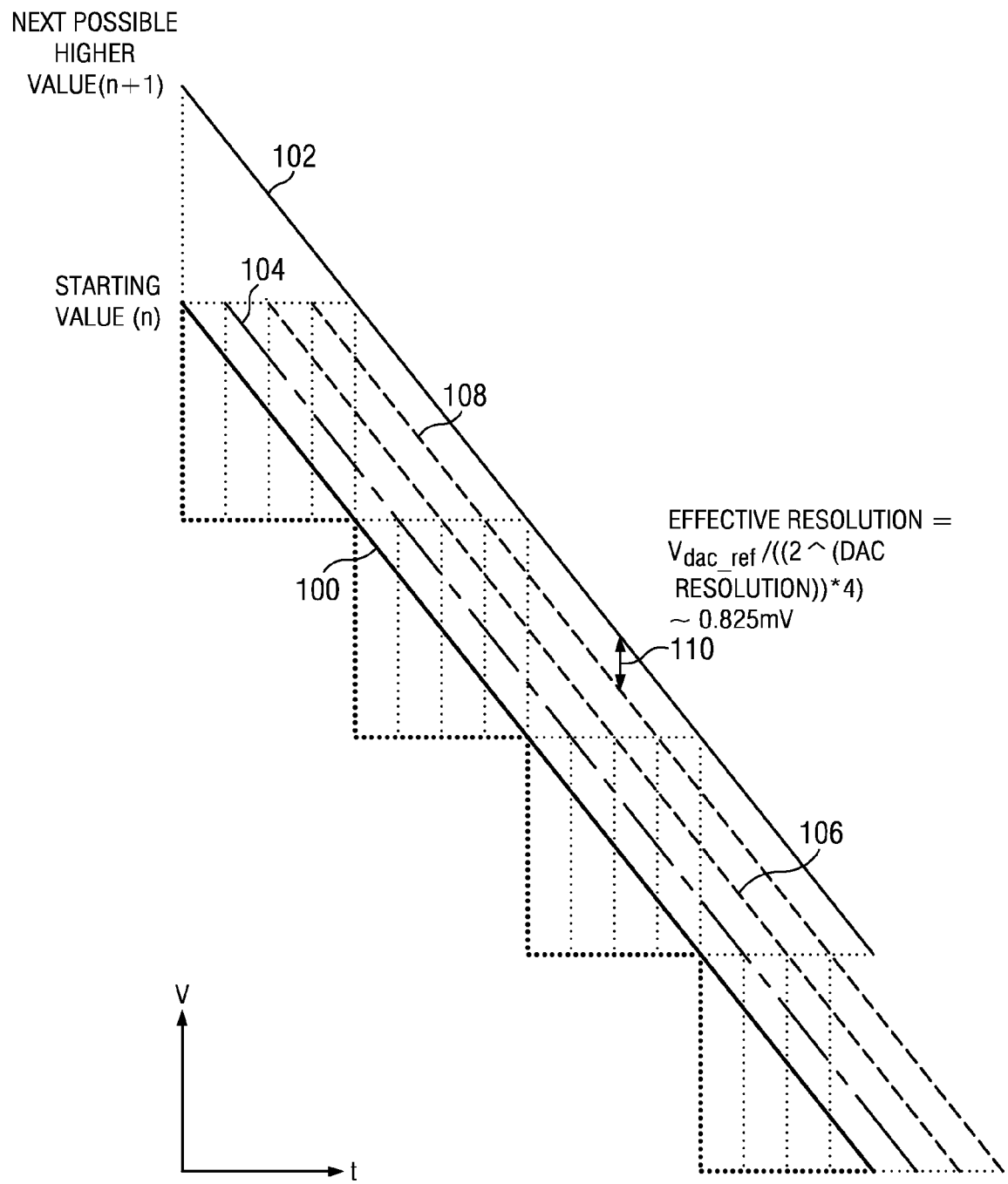
FIG. 7 is a graph of voltage verses time illustrating ramp generation behavior in a system that uses 3.3V as reference voltage for a 10-bit DAC having three time delayed ramp values.

FIG. 7, to which reference is now additionally made, shows a ramp generation behavior in a system that uses 3.3V as reference voltage for a 10-bit DAC. Thus, for example, the ramp 100 beginning from a starting value 'n' has a predefined slope. In the same manner, the ramp 102 beginning at value 'n+1' has the same slope. Between the ramps 100 and 102 are three additional possible ramps 104, 106, and 108, each beginning at respective successive clock cycles. The effective resolution 110 of this scheme is $$\frac{Vdac\_ref}{4 * 2^{DAC\ resolution}}.$$

In the case of a 10 bit DAC with a 3.3 volt reference voltage, the effective resolution 110 is approximately 0.825 mV.

Figure 8:
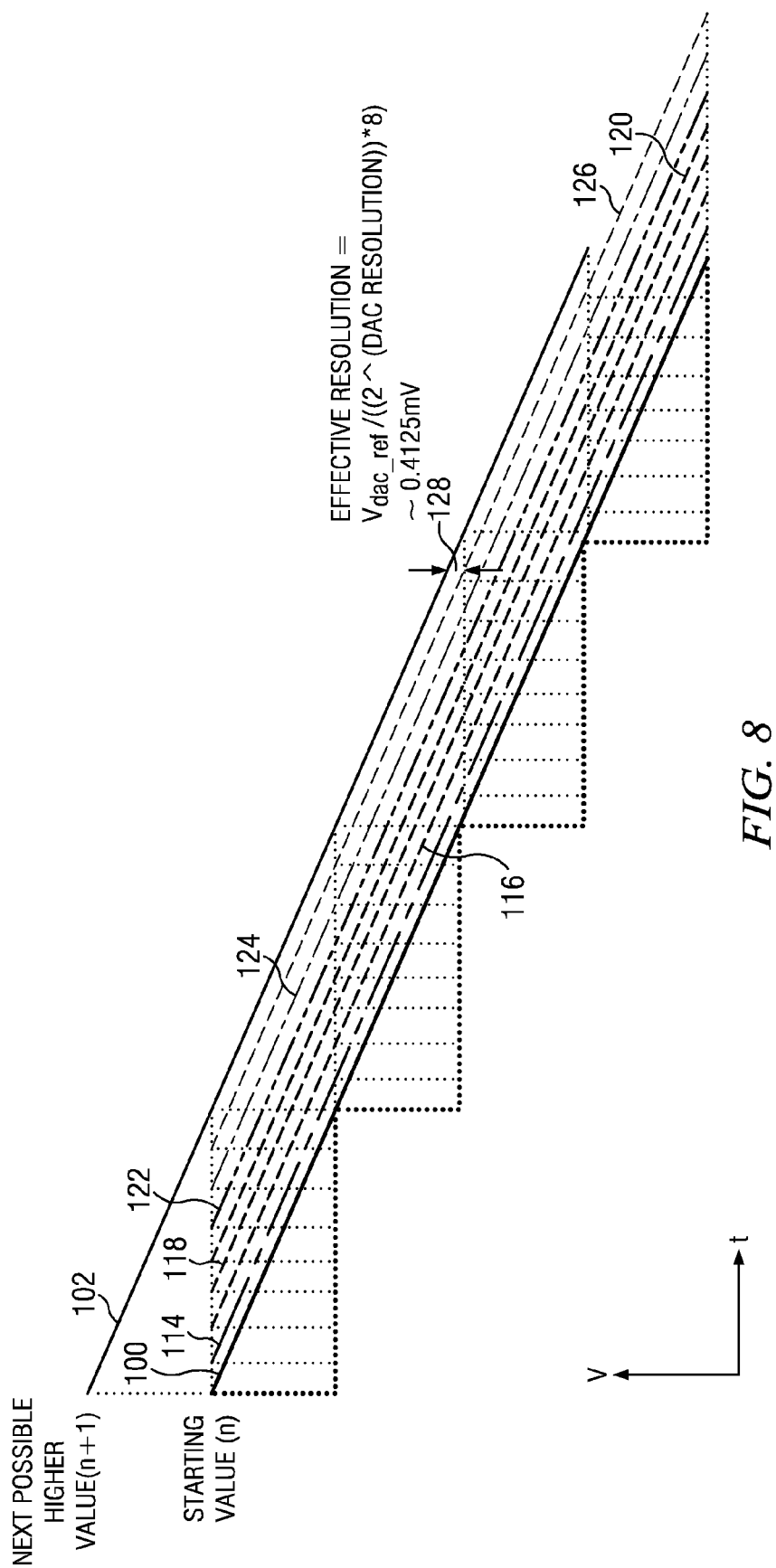
FIG. 8 is a graph of voltage verses time illustrating ramp generation behavior in a system that uses 3.3V as reference voltage for a 10-bit DAC having seven time delayed ramp values.

For a case in which the DAC is decremented by one step every eighth clock cycle (half the slope of previous example), there are seven possible delay steps between the two ramp values obtained from consecutive starting ramp values 'n' and 'n+1'. This is again obtained by delaying start of the ramp by one clock cycle at a time. This is shown in FIG. 8, to which reference is now additionally made.

Thus, between the ramp 100 beginning at a starting value of 'n' and the ramp 102 beginning at a starting value of 'n+1' are seven possible ramp values 114, 116, 118, 120, 122, 124, and 126, each beginning at successive one clock cycle increments after the starting value 'n'. Here, the effective resolution 128 is $$\frac{Vdac\_ref}{8 * 2^{DAC\ resolution}}.$$

In the case of a 10 bit DAC with a 3.3 volt reference voltage, the resolution is approximately 0.4125 mV.

In a system with a certain DAC resolution and a certain ramp generator clock frequency, the number of possible steps increases with decreasing slope. Therefore, the effective ramp resolution increases with decreasing slope. Similarly, for a constant slope, the number of possible steps increases with increasing ramp generator clock frequency. Therefore, the effective ramp resolution increases with increasing ramp generator clock frequency. In other words, for a constant DAC resolution, effective ramp resolution increase is directly proportional to the ramp generator clock frequency and inversely proportional to the ramp slope. The starting value of the ramp serves as a coarse adjustment, while the delay value provides for a fine adjustment.

Figure 3:
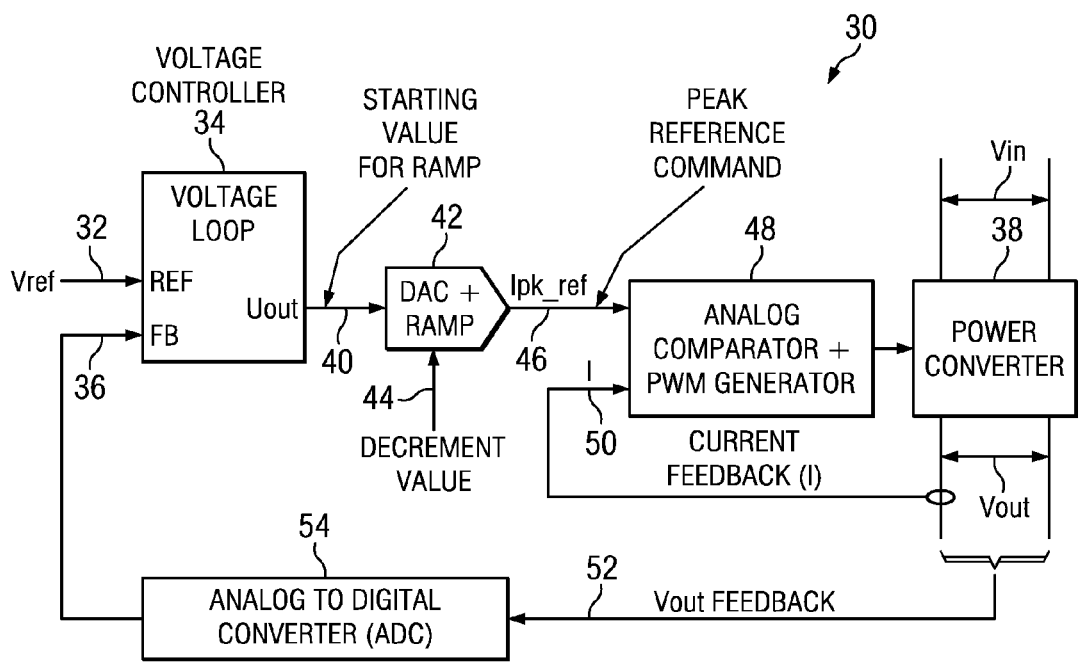
FIG. 3 is a box diagram of a peak current mode control (PCMC) system implementation using a DAC-ramp generator with voltage and current feedback loops.
Figure 4:
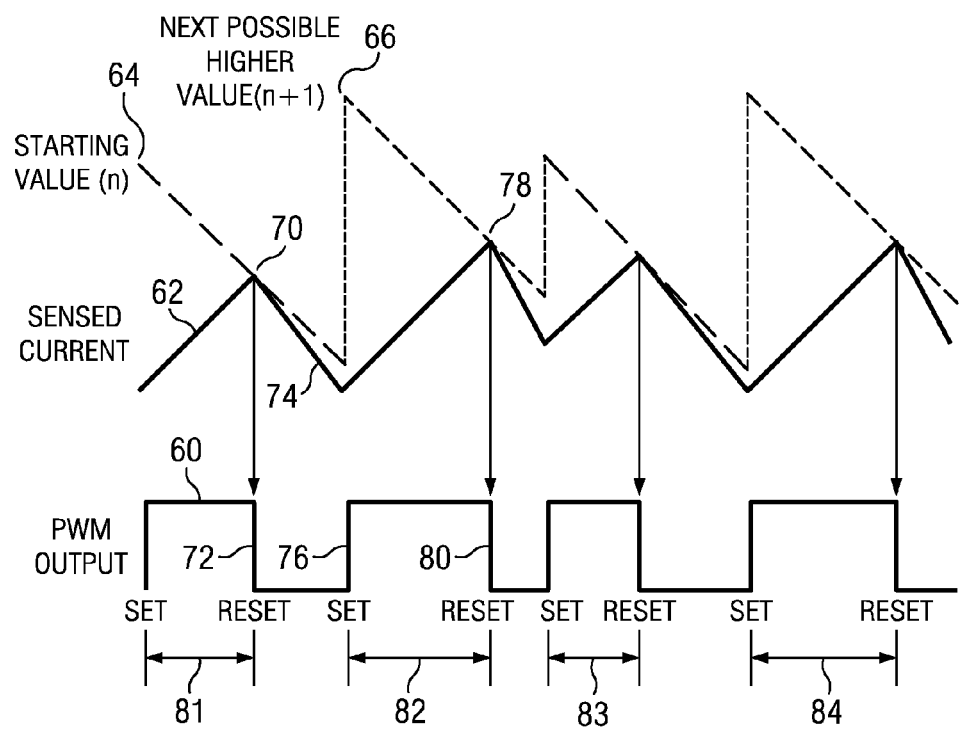
FIG. 4 shows various waveforms produced in the operation of the PCMC system of FIG. 3.
Figure 9:
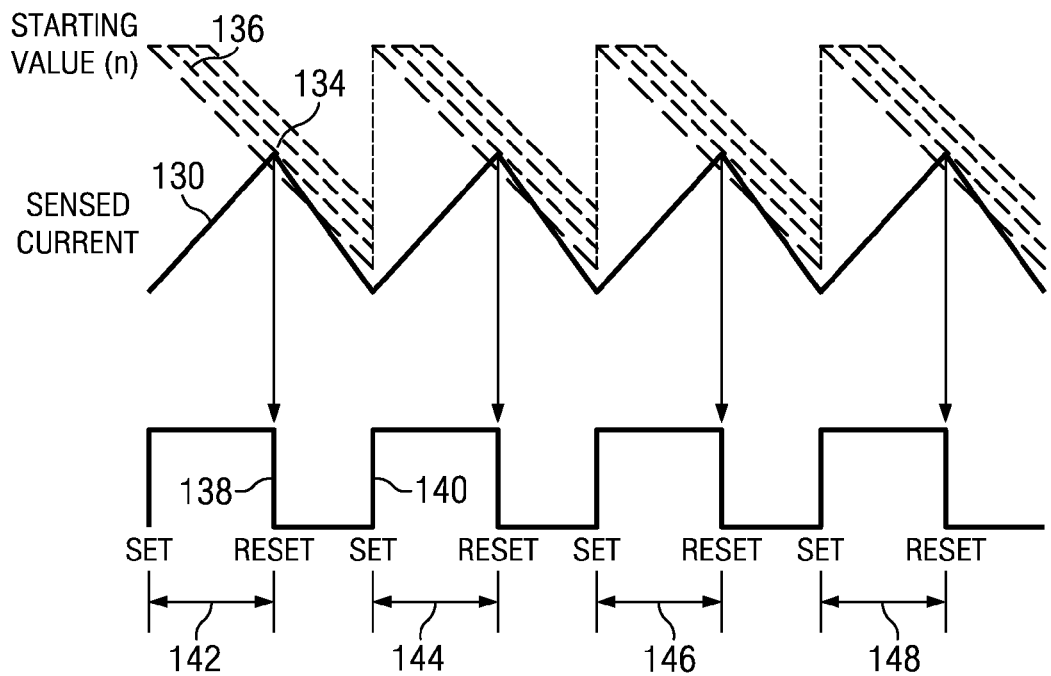
FIG. 9 shows PWM waveforms that can be obtained as a result of the higher resolution of the ramp signal in the PCMC system of FIG. 3.

For the system discussed above with reference to FIGS. 3 and 4, PWM waveforms with higher resolution duty cycle can be obtained as a result of the higher resolution of the ramp signal using this technique. Resolution increase for this example is four times that of the implementation in the example of FIG. 4, because the SAC is decremented by one step every fourth clock cycle. This is shown in FIG. 9, to which reference is now additionally made.

In a duty-cycle controlled power stage, every time the sensed current 130 reaches its peak reference limit 134 set by the peak reference command 136, the PWM waveform 138 is reset for the remaining time in the PWM period. The PWM waveform 140 is set again at the start of the next PWM cycle. As the process is repeated, because of the increased resolution of the DAC-ramp generator, the widths 142, 144, 146, and 148 of the successive PWM output pulses can be made to vary much less than the widths 81, 82, 83, and 84 of the PWM pulses of the example of FIG. 4 above, and, in the example illustrated, the widths of the PWM pulses are substantially equal.

Figure 10:
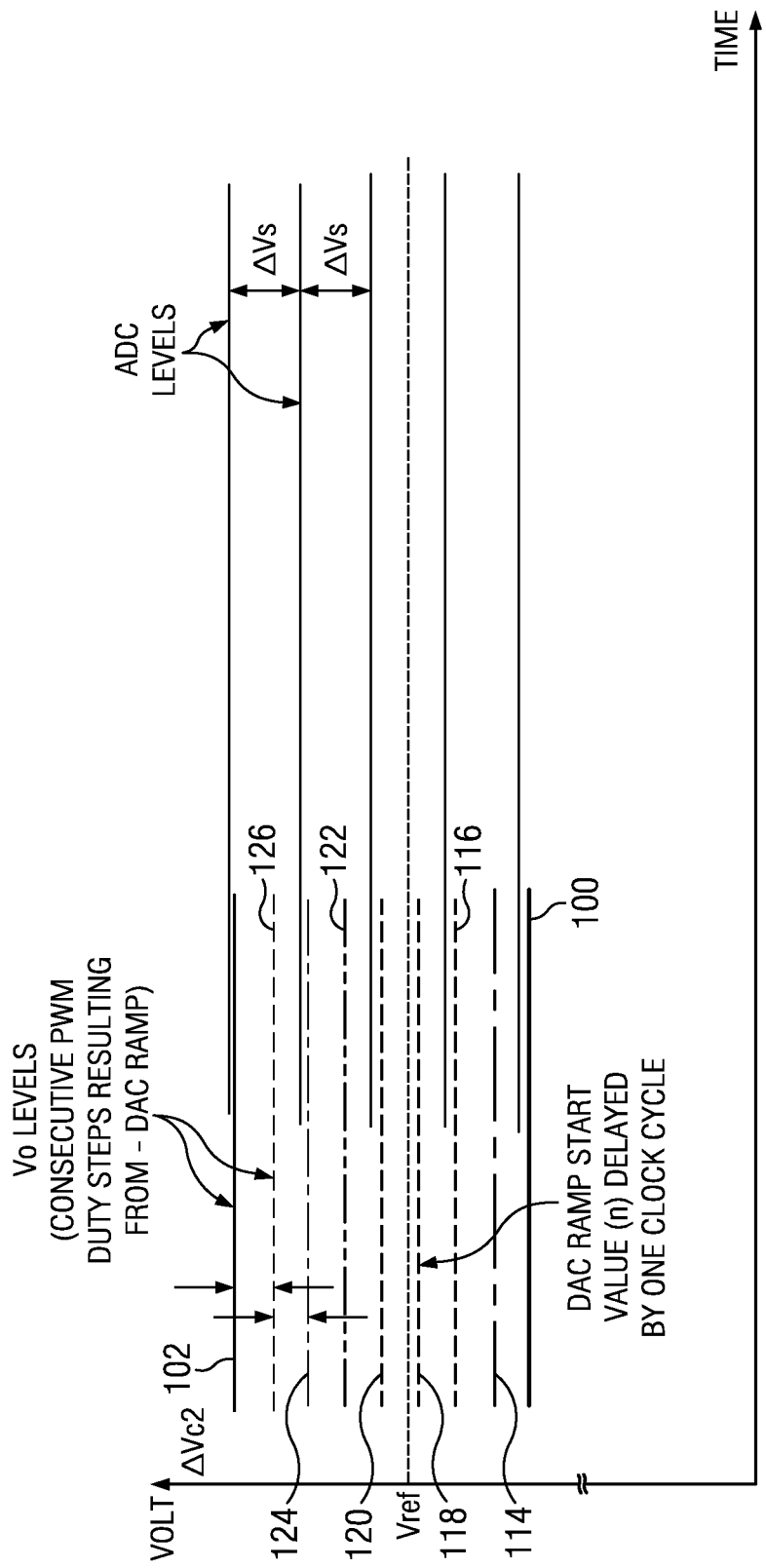
FIG. 10 is a graph of voltage verses time showing the difference between output voltage levels resulting from ramp signals generated by two consecutive time-delayed ramp starting values, and the difference between two consecutive output voltage levels that the ADC can distinguish.

With a desired output voltage level of $V_{ref}$ and with the delayed start of the ramps of the DAC-ramp generator, because of the higher ramp resolution, there are multiple output levels possible between two consecutive ADC steps/levels. This is shown in FIG. 10, to which reference is now additionally made.

Figure 5:
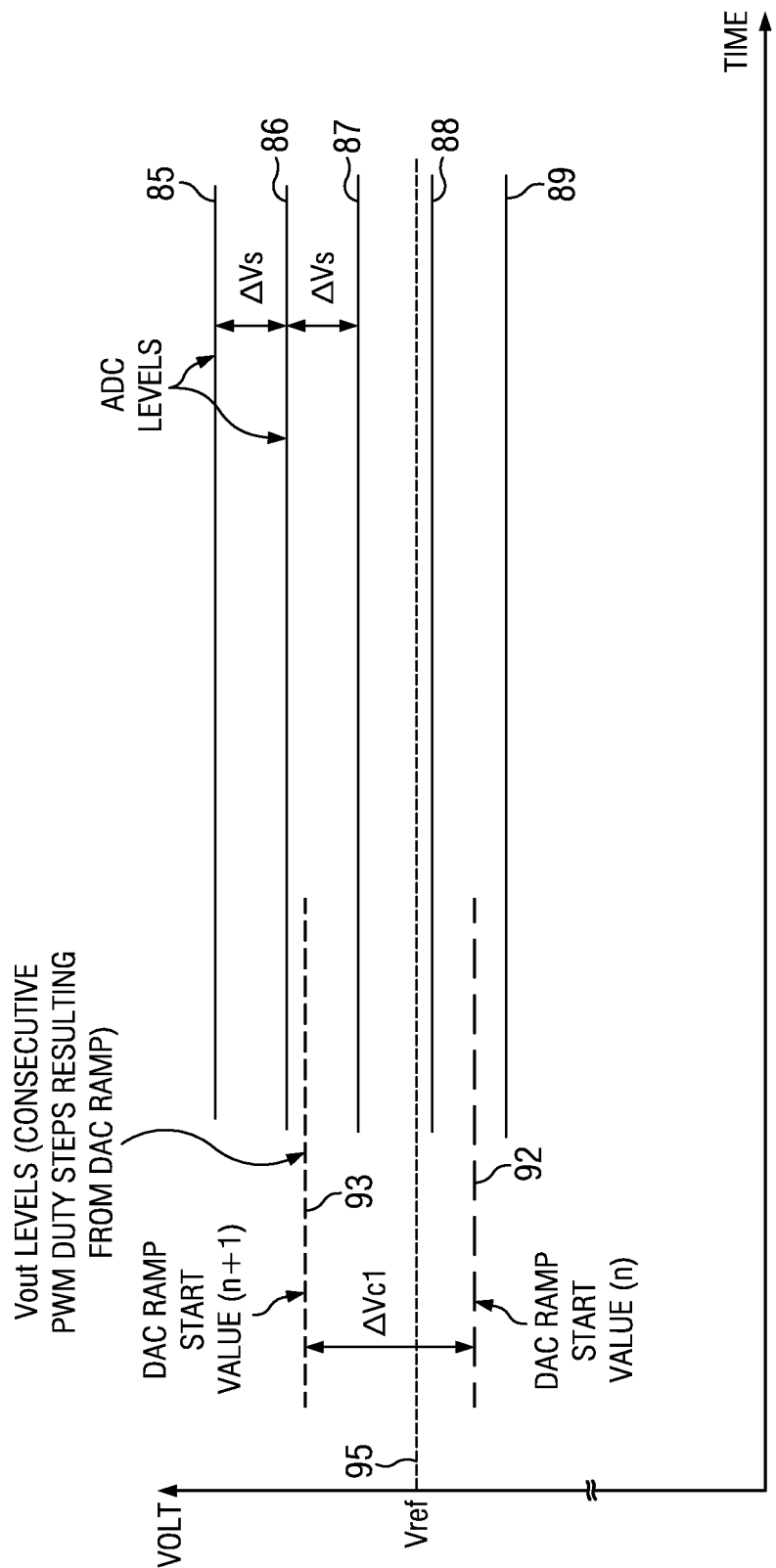
FIG. 5 is a graph of voltage verses time showing the difference between output voltage levels resulting from ramp signals generated by two consecutive ramp starting values, and the difference between two consecutive output voltage levels that the ADC can distinguish.

Because there are more possible output levels 100, 114, 116, 118, 120, 122, 124, 126, and 102 that can be generated by the DAC-ramp generator, for example, where the DAC-ramp generator is decremented by one step every fourth clock cycle, these output levels can be closer to each other than in previous systems. For example, the output levels 100, 114, 116, 118, 120, 122, 124, 126, and 102 in FIG. 10 are four times closer to each other than those in FIG. 5. This means:

$$\Delta Vc2 = (\Delta Vc1)/4$$

where:

ΔVc1=difference between two closest possible output voltage values or levels resulting from two consecutive ramp starting values in FIG. 5, and ΔVc2=difference between two closest possible output voltage values or levels resulting from delayed start of the ramp signal using the technique described above with reference to FIG. 10.

As mentioned before this increase of ramp resolution results in multiple possible output levels/steps between two consecutive ADC steps/levels. This means:

$$\Delta Vc2 < \Delta Vs$$

where,

ΔVs=difference between two consecutive output voltage values/levels that the ADC can distinguish.

Figure 6:
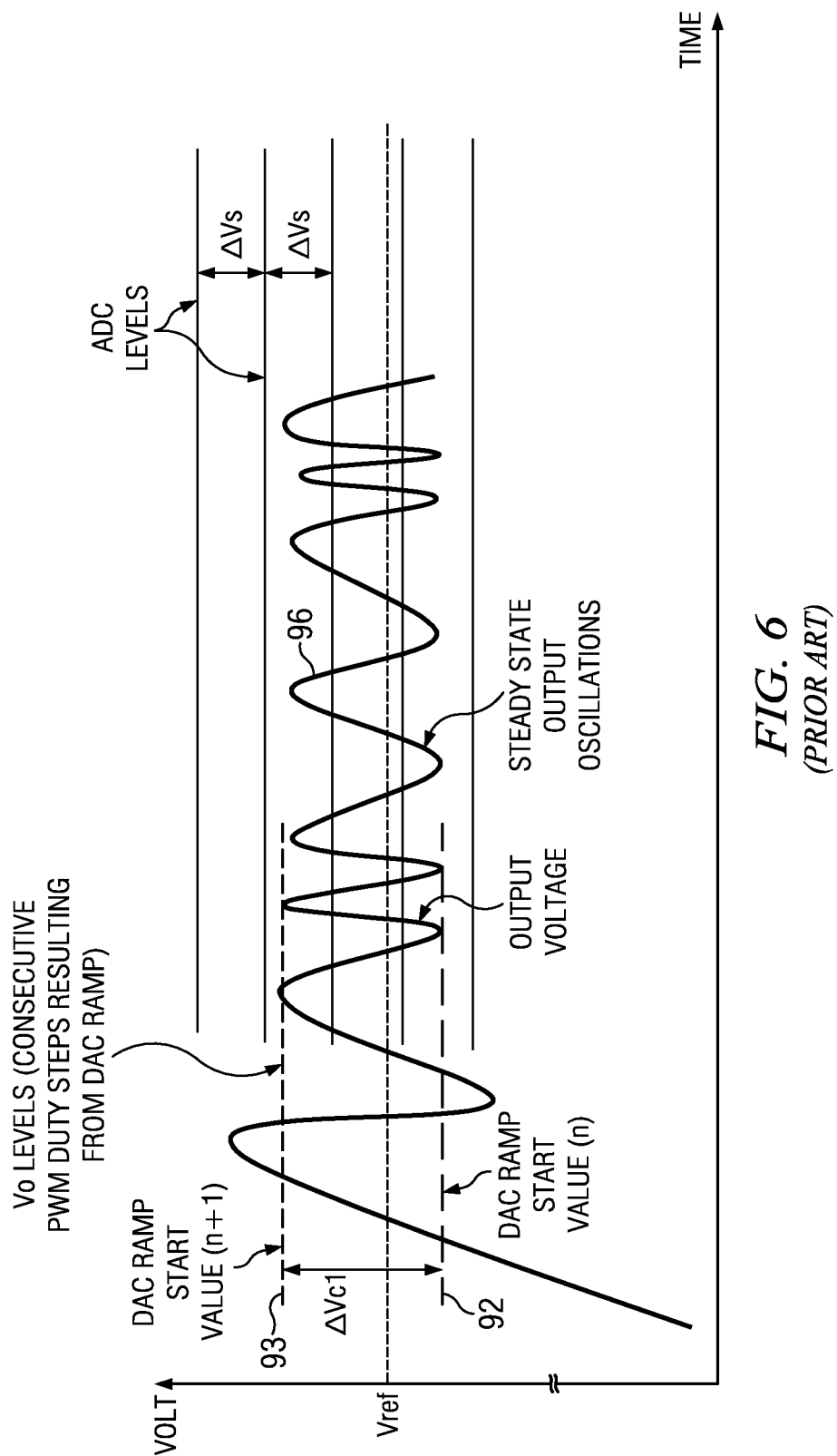
FIG. 6 is a graph of voltage verses time illustrating how the starting value of the ramp could then oscillate between two closest DAC starting values, 'n' and 'n+1', resulting in steady state oscillations at the system output.
Figure 11:
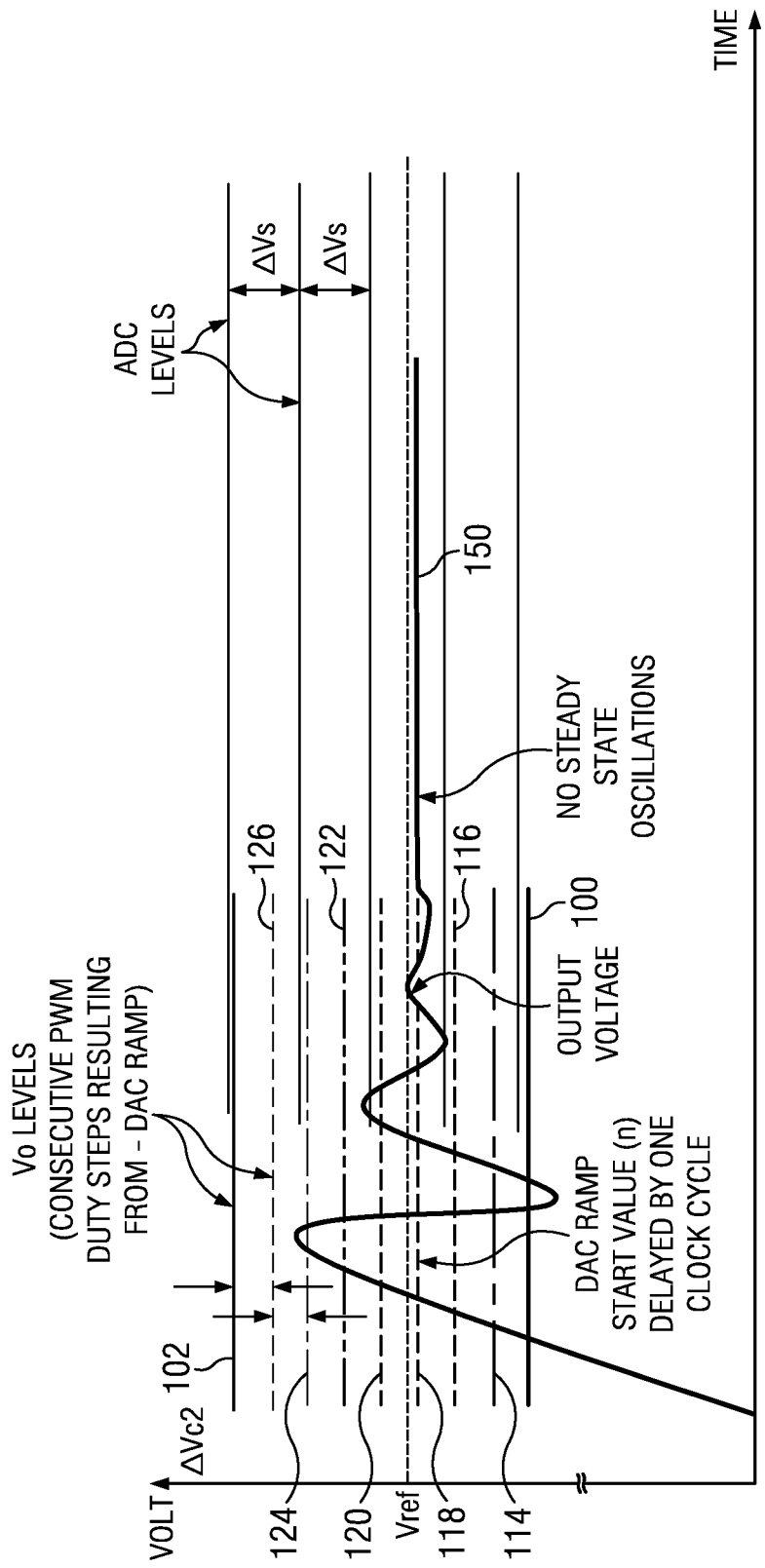
FIG. 11 is a graph of voltage verses time illustrating how the output voltage of the system of FIG. 3 can converge to a steady state level using the time delayed ramp voltage signals described herein.

Because of this the steady state oscillations at the system output, discussed above with reference to FIG. 6, are considerably reduced or eliminated. This is depicted in FIG. 11 to which reference is now additionally made. As shown, the steady state output voltage 150 is substantially constant between the reference voltage and the ramp voltage 118. One condition to avoid steady state oscillations is to have a ramp resolution that is greater than the ADC resolution.

As another example, for a system with 12-bit ADC resolution and 10-bit DAC resolution, the choice of slope and clock frequency should allow more than four ramp start delay steps between two ramps obtained from consecutive starting ramp values. In general to avoid steady state oscillations following relation should be satisfied:

$$\text{minimum number of delay steps required} > 2^{(ADC\ resolution - DAC\ resolution)},$$

where the ADC and DAC resolutions are expressed in number of bits.

This method provides more control steps, providing a higher control resolution to accurately control the desired output. Also, for systems where the ADC resolution is greater than the DAC resolution, this method can help reduce or eliminate the steady state oscillations on the output. Moreover, this mechanism may be software programmable, which allows easy adaptability for optimum performance under changing system or operating conditions and easy portability across multiple converter platforms. This may also be helpful in devising a good combination of power converter design and the corresponding digital controller selection to ensure meeting system requirements.

It should be noted, however, that for systems where the DAC is decremented by one step or more every clock cycle, there is no ramp resolution increase obtained by using the described technique. In these cases, ramp resolution is limited to the DAC resolution. To avoid this situation, knowledge of the amount of ramp resolution desired for the system can be used at the time of system design. A power converter design choice for a good combination of slope and the corresponding choice for the ramp generator mechanism clock frequency can then be made to ensure that the system requirements for ramp resolution are met. For example, the slope required for the converter may be reduced and/or the clock frequency for the ramp generator may be increased to ensure that the desired effective resolution can be achieved. Thus, a higher ramp resolution may be achieved for such a system without the need for a high resolution DAC.

Figure 12:
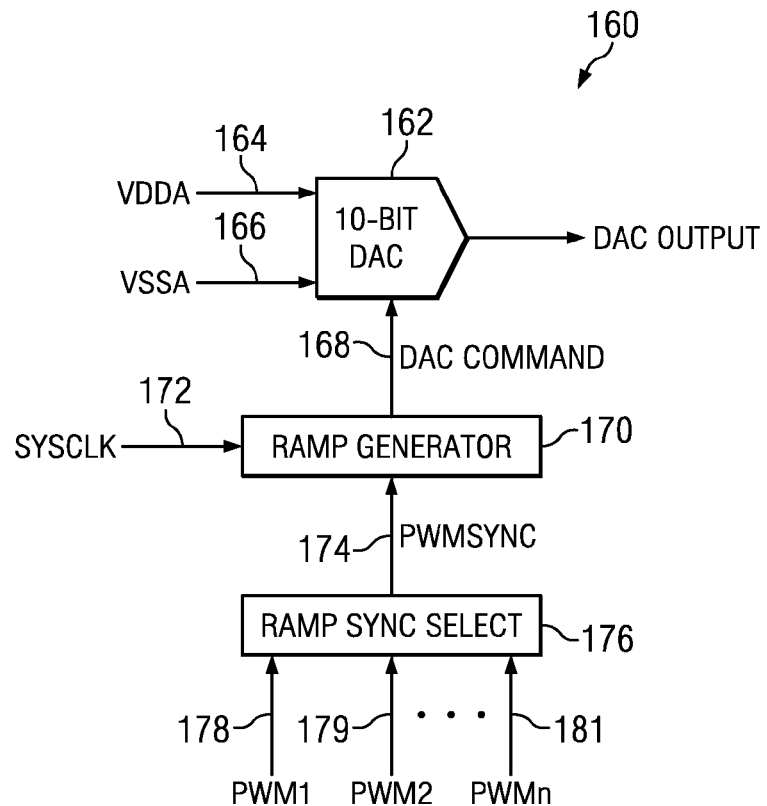
FIG. 12 is a box diagram of one example of a circuit for producing the delayed ramp voltage signals described herein.

The ramp generated by the DAC-ramp generator circuit 42 can be delayed in a number of ways. An example of one such way is shown in the block diagram of a DAC-ramp generator 160 shown in FIG. 12 to which reference is now additionally made. The DAC-ramp generator 160 includes a 10-bit DAC 162 which receives analog reference voltages VDDA and VSSA on respective input lines 164 and 166. A DAC command is received on a line 168 from a ramp generator 170. The ramp generator 170 is clocked by a clock signal (SYSCLK) on line 172, and receives a synchronization signal (PWM-SYNC) on line 174 that controls the start of the ramp signal.

A ramp synchronization selection circuit 176 selects between a number of PWM time base signals PWM1, PWM2, ... PWMn on respective lines 178, 179, ..., 181. The selected PWM signal, say PWM2, is phase shifted with respect to PWM1, where PWM1 is the PWM output signal used to control the power converter. This selected phase signal then serves as the trigger source for starting the ramp. Consequently, the amount of phase shift of PWM2 with respect to PWM1 dictates the amount of delay in this start of ramp. The amount of phase shift is based on the amount of delay required in the start of the ramp signal generated by the ramp generator 170. Thus, with the PWM synchronization on line 174 starting the ramp signal from the ramp generator 170, the necessary delays of the ramp signals (for example ramp signals 100, 114, 116 118, 120, 122, 124, 126, and 102 shown in FIG. 8) can be determined by controlling the phase of the selected PWM signal with respect to the PWM1 reference signal. This PWM signal is selected using the ramp synchronization select circuit 176.

There are a number of other ways by which the ramp delay may be achieved. For example, a timer or counting mechanism may be used as the trigger source to start the ramp. The timer or counting mechanism can then provide a delay in this trigger with respect to the PWM1 reference signal. A myriad of other mechanisms may be used as well. For example, in the example described above of one DAC step decrement every four clock cycles, a coarse DAC value of 12 ('n' or 'n+1') may be used and a fine value resulting in a delay of two (which is less than four clock cycles) may be used. A similar resulting behavior can be obtained, however, by using a coarse value of 11 and a delay of six (i.e., 4+2) clock cycles, or a coarse value of ten and delay of ten clock cycles (i.e., 4+4+2), and so on. In this case, the idea is the same, that is, delaying the start of ramp. However, instead of delaying by less than four clock cycles, the delay used may be six clock cycles, 10 clock cycles, and so on. Consequently, the phrase "delaying an output of said DAC for a number of clock pulses" is used herein to mean performing an operation that results in an effect that is substantially the same as delaying an output of the DAC from a coarse starting value to achieve an effective increase in the possible ramp signal resolution.

In any event, a higher ramp resolution can be achieved without a corresponding increase in the DAC resolution. Moreover, the method can be implemented on digital controllers, for instance, on microcontroller units (MCUs), digital signal processors (DSPs) used for controlling power converters, and the like. Another advantage is that the method described herein can be used in conjunction with existing ramp and DAC mechanisms in digital controllers, with minimal or no additional digital logic depending on the original implementation of this mechanism. The method can be implemented using simple digital logic, and software programmable mechanisms that allows easy adaptability for optimum performance under changing system or operating conditions and for easy portability across multiple converter platforms. The method, system, circuits, and computer program products described herein are helpful in devising a good combination of power converter design with a corresponding digital controller selection to ensure that system requirements can be met.

Thus, higher ramp resolution can be achieved than is possible with conventional ramp generator mechanisms, without a need for a high resolution DAC. The system can be software programmable, using existing ramp and DAC mechanisms with minimal or no additional digital logic.

It should be noted that although the examples described above depicted a DAC that decrements to a next DAC state after a fixed number of clock pulses have occurred, a DAC could also be implemented that increments to a next DAC state after a fixed number of clock pulses have occurred. The delayed start of the ramp voltage, therefore, occurs on the occurrence of clock cycles that are less than the fixed number of clock pulses on which the DAC decrements (or increments). Moreover, the same effect can also be obtained by advancing the ramp instead of delaying. The action of advancing is also in effect obtained by delaying by a negative amount or by a large amount in the previous cycle. Furthermore, in the figures, the DAC-Ramp output has been shown such that it resets at the end of a PWM cycle. However, those skilled in the art will understand that the DAC-Ramp output may also be reset when the PWM is reset in the PWM cycle.

Electrical connections, couplings, and connections have been described with respect to various devices or elements. The connections and couplings may be direct or indirect. A connection between a first and second electrical device may be a direct electrical connection or may be an indirect, electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. A system for controlling a power converter, comprising:
a digital-to-analog converter (DAC) the DAC being configured to clock to a next state after a fixed number of clock pulses have occurred;
a ramp generator to generate a reference current command, the reference current command to control an output of the power converter; and
a ramp synchronization selection circuit to delay an output of the DAC for a number of clock pulses less than the fixed number to increase a resolution of the DAC.

2. The system of claim 1 wherein the next state is a decrement state of the DAC.

3. The system of claim 1 wherein the next state is an increment state of the DAC.

4. The system of claim 1 wherein a slope of an output of the ramp generator is based on the fixed number of clock pulses.

5. The system of claim 1 further including:
an analog comparator to receive the reference current command and a feedback current representing an output of the power converter; and
a PWM generator to produce a PWM voltage for controlling an output of the power converter in response to a comparison of the feedback current and the reference current command.

6. The system of claim 5 further including:
an analog-to-digital converter (ADC) to receive an output voltage from the power converter and to provide a digital signal representing the output voltage; and
a voltage controller to compare a reference voltage and the digital signal representing the output voltage, and to provide a starting value to the DAC.

7. The system of claim 6 wherein a voltage difference between adjacent delayed outputs of the DAC is less than a voltage difference creating different adjacent output states of the ADC.

8. The system of claim 1 wherein the ramp synchronization selection circuit is to delay the output of the DAC by outputting a phase shifted copy of a pulse width modulated signal used to control the power converter.

9. A method for controlling a power converter, comprising:
generating a ramp output signal upon which an output from the power converter is based;
clocking a digital-to-analog converter (DAC) to a next state after a fixed number of clock pulses; and
delaying a start of the DAC for a number of clock pulses less than the fixed number of clock pulses.

10. The method of claim 9 wherein the next state is a decrement state of the DAC.

11. The method of claim 9 wherein the next state is an increment state of the DAC.

12. The method of claim 9 further including controlling an output of the power converter according to a comparison between the ramp signal and a signal representing a current feedback from the power converter.

13. The method of claim 9 further including:
producing a digital output signal representing an output voltage of the power converter; and
comparing the digital output signal with a reference voltage to provide a starting value to the DAC.

14. The method of claim 13 wherein a voltage difference between adjacent delayed outputs of the DAC is less than a voltage difference creating different adjacent output states of the ADC.

15. The method of claim 9 wherein delaying the start of the DAC includes outputting a phase shifted copy of a pulse width modulated signal used to control the power converter.

* * * * *